(12) United States Patent
Huang et al.

(10) Patent No.: US 9,184,088 B2
(45) Date of Patent: *Nov. 10, 2015

(54) METHOD OF MAKING A SHALLOW TRENCH ISOLATION (STI) STRUCTURES

(71) Applicant: TAIWAN SEMICONDUCTOR MANUFACTURING COMPANY, LTD., Hsinchu (TW)

(72) Inventors: Yu-Lien Huang, Jhubei (TW); Chun Hsiung Tsai, Xinpu Township (TW); Chii-Ming Wu, Taipei (TW); Ziwei Fang, Baoshan Township (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 69 days.

This patent is subject to a terminal disclaimer.

(21) Appl. No.: 14/062,953

(22) Filed: Oct. 25, 2013

(65) Prior Publication Data

US 2014/0120693 A1    May 1, 2014

Related U.S. Application Data

(63) Continuation of application No. 13/012,948, filed on Jan. 25, 2011, now Pat. No. 8,592,915.

(51) Int. Cl.
| | |
|---|---|
| *H01L 21/76* | (2006.01) |
| *H01L 21/762* | (2006.01) |
| *H01L 21/02* | (2006.01) |
| *H01L 21/311* | (2006.01) |
| *H01L 21/3115* | (2006.01) |

(52) U.S. Cl.
CPC .... *H01L 21/76237* (2013.01); *H01L 21/02321* (2013.01); *H01L 21/31111* (2013.01); *H01L 21/31155* (2013.01); *H01L 21/76224* (2013.01)

(58) Field of Classification Search
USPC .......................... 438/424, 400, 246, 561, 528
See application file for complete search history.

(56) References Cited

U.S. PATENT DOCUMENTS

| | | |
|---|---|---|
| 5,581,202 A | 12/1996 | Yano et al. |
| 5,767,732 A | 6/1998 | Lee et al. |
| 5,963,789 A | 10/1999 | Tsuchiaki |

(Continued)

FOREIGN PATENT DOCUMENTS

| | | |
|---|---|---|
| CN | 1449012 | 10/2003 |
| CN | 1945829 | 4/2004 |

(Continued)

OTHER PUBLICATIONS

Office Action dated Dec. 9, 2013 from corresponding application No. CN 201210020656.0.

(Continued)

*Primary Examiner* — Samuel Gebremariam
(74) *Attorney, Agent, or Firm* — Hauptman Ham, LLP

(57) ABSTRACT

A method of making shallow trench isolation (STI) structures includes forming a first opening in a substrate and filling the first opening with silicon oxide to form a first STI structure. The method further includes doping a top surface of the silicon oxide with carbon, wherein a bottom portion of the silicon oxide is free of carbon. The method further includes planarizing the silicon oxide so that the top surface of the silicon oxide is at substantially a same level as a surface of the substrate surrounding the silicon oxide.

20 Claims, 6 Drawing Sheets

(56) References Cited

U.S. PATENT DOCUMENTS

| | | | |
|---|---|---|---|
| 6,121,786 A | 9/2000 | Yamagami et al. |
| 6,503,794 B1 | 1/2003 | Watanabe et al. |
| 6,613,634 B2 | 9/2003 | Ootsuka et al. |
| 6,622,738 B2 | 9/2003 | Scovell |
| 6,642,090 B1 | 11/2003 | Fried et al. |
| 6,706,571 B1 | 3/2004 | Yu et al. |
| 6,713,365 B2 | 3/2004 | Lin et al. |
| 6,727,557 B2 | 4/2004 | Takao |
| 6,743,673 B2 | 6/2004 | Watanabe et al. |
| 6,762,448 B1 | 7/2004 | Lin et al. |
| 6,791,155 B1 | 9/2004 | Lo et al. |
| 6,828,646 B2 | 12/2004 | Marty et al. |
| 6,830,994 B2 | 12/2004 | Mitsuki et al. |
| 6,858,478 B2 | 2/2005 | Chau et al. |
| 6,872,647 B1 | 3/2005 | Yu et al. |
| 6,940,747 B1 | 9/2005 | Sharma et al. |
| 6,949,768 B1 | 9/2005 | Anderson et al. |
| 6,964,832 B2 | 11/2005 | Moniwa et al. |
| 7,009,273 B2 | 3/2006 | Inoh et al. |
| 7,018,901 B1 | 3/2006 | Thean et al. |
| 7,026,232 B1 | 4/2006 | Koontz et al. |
| 7,067,400 B2 | 6/2006 | Bedell et al. |
| 7,078,312 B1 | 7/2006 | Sutanto et al. |
| 7,084,079 B2 | 8/2006 | Conti et al. |
| 7,084,506 B2 | 8/2006 | Takao |
| 7,112,495 B2 | 9/2006 | Ko et al. |
| 7,153,744 B2 | 12/2006 | Chen et al. |
| 7,157,351 B2 | 1/2007 | Cheng et al. |
| 7,190,050 B2 | 3/2007 | King et al. |
| 7,193,399 B2 | 3/2007 | Aikawa |
| 7,247,887 B2 | 7/2007 | King et al. |
| 7,265,008 B2 | 9/2007 | King et al. |
| 7,265,418 B2 | 9/2007 | Yun et al. |
| 7,297,600 B2 | 11/2007 | Oh et al. |
| 7,300,837 B2 | 11/2007 | Chen et al. |
| 7,323,375 B2 | 1/2008 | Yoon et al. |
| 7,351,622 B2 | 4/2008 | Buh et al. |
| 7,358,166 B2 | 4/2008 | Agnello et al. |
| 7,361,563 B2 | 4/2008 | Shin et al. |
| 7,374,986 B2 | 5/2008 | Kim et al. |
| 7,394,116 B2 | 7/2008 | Kim et al. |
| 7,396,710 B2 | 7/2008 | Okuno |
| 7,407,847 B2 | 8/2008 | Doyle et al. |
| 7,410,844 B2 | 8/2008 | Li et al. |
| 7,425,740 B2 | 9/2008 | Liu et al. |
| 7,442,967 B2 | 10/2008 | Ko et al. |
| 7,456,087 B2 | 11/2008 | Cheng |
| 7,494,862 B2 | 2/2009 | Doyle et al. |
| 7,508,031 B2 | 3/2009 | Liu et al. |
| 7,528,465 B2 | 5/2009 | King et al. |
| 7,534,689 B2 | 5/2009 | Pal et al. |
| 7,538,387 B2 | 5/2009 | Tsai |
| 7,550,332 B2 | 6/2009 | Yang |
| 7,598,145 B2 | 10/2009 | Damlencourt et al. |
| 7,605,449 B2 | 10/2009 | Liu et al. |
| 7,682,911 B2 | 3/2010 | Jang et al. |
| 7,737,009 B2 | 6/2010 | Lindsay et al. |
| 7,759,228 B2 | 7/2010 | Sugiyama et al. |
| 7,795,097 B2 | 9/2010 | Pas |
| 7,798,332 B1 | 9/2010 | Brunet |
| 7,804,130 B1 | 9/2010 | Fung |
| 7,820,513 B2 | 10/2010 | Hareland et al. |
| 7,851,865 B2 | 12/2010 | Anderson et al. |
| 7,868,317 B2 | 1/2011 | Yu et al. |
| 7,898,041 B2 | 3/2011 | Radosavljevic et al. |
| 7,923,321 B2 | 4/2011 | Lai et al. |
| 7,923,339 B2 | 4/2011 | Meunier-Beillard et al. |
| 7,960,791 B2 | 6/2011 | Anderson et al. |
| 7,985,633 B2 | 7/2011 | Cai et al. |
| 7,989,846 B2 | 8/2011 | Furuta |
| 7,989,855 B2 | 8/2011 | Narihiro |
| 8,003,466 B2 | 8/2011 | Shi et al. |
| 8,043,920 B2 | 10/2011 | Chan et al. |
| 8,076,189 B2 | 12/2011 | Grant |
| 8,101,475 B2 | 1/2012 | Oh et al. |
| 8,877,602 B2 * | 11/2014 | Huang et al. | 438/424 |
| 2003/0080361 A1 | 5/2003 | Murthy et al. |
| 2003/0109086 A1 | 6/2003 | Arao |
| 2003/0234422 A1 | 12/2003 | Wang et al. |
| 2004/0075121 A1 | 4/2004 | Yu et al. |
| 2004/0129998 A1 | 7/2004 | Inoh et al. |
| 2004/0192067 A1 | 9/2004 | Ghyselen et al. |
| 2004/0219722 A1 | 11/2004 | Pham et al. |
| 2004/0259315 A1 | 12/2004 | Sakaguchi et al. |
| 2005/0020020 A1 | 1/2005 | Collaert et al. |
| 2005/0051865 A1 | 3/2005 | Lee et al. |
| 2005/0082616 A1 | 4/2005 | Chen et al. |
| 2005/0153490 A1 | 7/2005 | Yoon et al. |
| 2005/0170593 A1 | 8/2005 | Kang et al. |
| 2005/0212080 A1 | 9/2005 | Wu et al. |
| 2005/0221591 A1 | 10/2005 | Bedell et al. |
| 2005/0224800 A1 | 10/2005 | Lindert et al. |
| 2005/0233598 A1 | 10/2005 | Jung et al. |
| 2005/0266698 A1 | 12/2005 | Cooney et al. |
| 2005/0280102 A1 | 12/2005 | Oh et al. |
| 2006/0038230 A1 | 2/2006 | Ueno et al. |
| 2006/0068553 A1 | 3/2006 | Thean et al. |
| 2006/0091481 A1 | 5/2006 | Li et al. |
| 2006/0091482 A1 | 5/2006 | Kim et al. |
| 2006/0091937 A1 | 5/2006 | Do |
| 2006/0105557 A1 | 5/2006 | Klee et al. |
| 2006/0128071 A1 | 6/2006 | Rankin et al. |
| 2006/0135046 A1 | 6/2006 | Prince et al. |
| 2006/0138572 A1 | 6/2006 | Arikado et al. |
| 2006/0151808 A1 | 7/2006 | Chen et al. |
| 2006/0153995 A1 | 7/2006 | Narwankar et al. |
| 2006/0166475 A1 | 7/2006 | Mantl |
| 2006/0214212 A1 | 9/2006 | Horita et al. |
| 2006/0258156 A1 | 11/2006 | Kittl |
| 2007/0001173 A1 | 1/2007 | Brask et al. |
| 2007/0004218 A1 | 1/2007 | Lee et al. |
| 2007/0015334 A1 | 1/2007 | Kittl et al. |
| 2007/0020827 A1 | 1/2007 | Buh et al. |
| 2007/0024349 A1 | 2/2007 | Tsukude |
| 2007/0029576 A1 | 2/2007 | Nowak et al. |
| 2007/0048907 A1 | 3/2007 | Lee et al. |
| 2007/0076477 A1 | 4/2007 | Hwang et al. |
| 2007/0093010 A1 | 4/2007 | Mathew et al. |
| 2007/0093036 A1 | 4/2007 | Cheng et al. |
| 2007/0096148 A1 | 5/2007 | Hoentschel et al. |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2007/0145487 A1 | 6/2007 | Kavalieros et al. |
| 2007/0152276 A1 | 7/2007 | Arnold et al. |
| 2007/0166929 A1 | 7/2007 | Matsumoto et al. |
| 2007/0178637 A1 | 8/2007 | Jung et al. |
| 2007/0221956 A1 | 9/2007 | Inaba |
| 2007/0236278 A1 | 10/2007 | Hur et al. |
| 2007/0241414 A1 | 10/2007 | Narihiro |
| 2007/0247906 A1 | 10/2007 | Watanabe et al. |
| 2007/0254440 A1 | 11/2007 | Daval |
| 2008/0001171 A1 | 1/2008 | Tezuka et al. |
| 2008/0036001 A1 | 2/2008 | Yun et al. |
| 2008/0042209 A1 | 2/2008 | Tan et al. |
| 2008/0050882 A1 | 2/2008 | Bevan et al. |
| 2008/0085580 A1 | 4/2008 | Doyle et al. |
| 2008/0085590 A1 | 4/2008 | Yao et al. |
| 2008/0095954 A1 | 4/2008 | Gabelnick et al. |
| 2008/0102586 A1 | 5/2008 | Park |
| 2008/0124878 A1 | 5/2008 | Cook et al. |
| 2008/0227241 A1 | 9/2008 | Nakabayashi et al. |
| 2008/0265344 A1 | 10/2008 | Mehrad et al. |
| 2008/0290470 A1 | 11/2008 | King et al. |
| 2008/0296632 A1 | 12/2008 | Moroz et al. |
| 2008/0318392 A1 | 12/2008 | Hung et al. |
| 2009/0026540 A1 | 1/2009 | Sasaki et al. |
| 2009/0039388 A1 | 2/2009 | Teo et al. |
| 2009/0066763 A1 | 3/2009 | Fujii et al. |
| 2009/0098706 A1 | 4/2009 | Kim et al. |
| 2009/0155969 A1 | 6/2009 | Chakravarti et al. |
| 2009/0166625 A1 | 7/2009 | Ting et al. |

(56) References Cited

U.S. PATENT DOCUMENTS

| | | | |
|---|---|---|---|
| 2009/0181477 | A1 | 7/2009 | King et al. |
| 2009/0200612 | A1 | 8/2009 | Koldiaev |
| 2009/0239347 | A1 | 9/2009 | Ting et al. |
| 2009/0321836 | A1 | 12/2009 | Wei et al. |
| 2010/0155790 | A1 | 6/2010 | Lin et al. |
| 2010/0163926 | A1 | 7/2010 | Hudait et al. |
| 2010/0187613 | A1 | 7/2010 | Colombo et al. |
| 2010/0207211 | A1 | 8/2010 | Sasaki et al. |
| 2010/0308379 | A1 | 12/2010 | Kuan et al. |
| 2011/0018065 | A1 | 1/2011 | Curatola et al. |
| 2011/0108920 | A1 | 5/2011 | Basker et al. |
| 2011/0129990 | A1 | 6/2011 | Mandrekar et al. |
| 2011/0195555 | A1 | 8/2011 | Tsai et al. |
| 2011/0195570 | A1 | 8/2011 | Lin et al. |
| 2011/0256682 | A1 | 10/2011 | Yu et al. |
| 2012/0086053 | A1 | 4/2012 | Tseng et al. |

FOREIGN PATENT DOCUMENTS

| | | |
|---|---|---|
| CN | 101179046 | 5/2005 |
| CN | 101459116 | 6/2009 |
| EP | 1152460 | 11/2001 |
| JP | 2007-194336 | 8/2007 |
| KR | 10-2005-0119424 | 12/2005 |
| KR | 1020070064231 | 6/2007 |
| TW | 497253 | 8/2002 |
| WO | 2007/115585 | 10/2007 |

OTHER PUBLICATIONS

Office Action dated Jan. 22, 2014 from corresponding application No. TW 100125078.

Shikida, Mitsuhiro et al., "Comparison of Anisotropic Etching Properties Between KOH and TMAH Solutions", Depto. of Micro System Engineering, Nagoya University, Chikusa, Nagoya, 464-8603, Japan, IEEE Jun. 30, 2010, pp. 315-320.

Lenoble, Damien, "Plasma Doping as an Alternative Route for Ultra Shallow Junction Integration to Standard CMOS Technologies", STMicroelectronics, Crolles Cedex, France, Semiconductor Fabtech, 16th Edition, pp. 1-5.

Chui, King-Jien et al., "Source/Drain Germanium Condensation for P-Channel Strained Ultra-Thin Body Transistors", Silicon Nano Device Lab, Dept. of Electrical and Computer Engineering, National University of Singapore, IEEE 2005.

Quirk et al., Semiconductor Manufacturing Technology, Oct. 2001, Prentice Hall, Chapter 16.

McVittie, James P., et al., "SPEEDIE: A Profile Simulator for Etching and Deposition", Proc. SPIE 1392, 126 (1991).

90 nm Technology. retrieved from the internet <URL:http://tsmc.com/english/dedicatedFoundry/technology/90nm.htm.

Merriam Webster definition of substantially retrieved from the internet <URL:http://www.merriam-webster.com/dictionary/substantial>.

Smith, Casey Eben, Advanced Technology for Source Drain Resistance, Diss. University of North Texas, 2008.

Liow, Tsung-Yang et al., "Strained N-Channel FinFETs Featuring In Situ Doped Silicon—Carbon $Si_{1-Y}C_y$ Source Drain Stressors with High Carbon Content", IEEE Transactions on Electron Devices 55.9 (2008): 2475-483.

Office Action dated Mar. 28, 2012 from corresponding application No. CN201010228334.6.

Notice of Decision on Patent dated Mar. 12, 2012 from corresponding application No. 10-2010-0072103.

OA dated Mar. 27, 2012 from corresponding application No. KR10-2010-0094454.

Oa dated Mar. 29, 2012 from corresponding application no. KR10-2010-0090264.

Office Action dated May 2, 2012 from corresponding application No. CN 201010196345.0.

Office Action dated May 4, 2012 from corresponding application No. CN 201010243667.6.

Anathan, Hari, et al., "FinFet SRAM—Device and Circuit Design Considerations", Quality Electronic Design, 2004, Proceedings 5th International Symposium (2004); pp. 511-516.

Jha, Niraj, Low-Power FinFET Circuit Design, Dept. of Electrical Engineering, Princeton University n.d.

Kedzierski, J., et al., "Extension and Source/Drain Design for High-Performance FinFET Devices", IEEE Transactions on Electron Devices, vol. 50, No. 4, Apr. 2033, pp. 952-958.

Liow, Tsung-Yang et al., "Strained N-Channel FinFETs with 25nm Gate Length and Silicon—Carbon Source/Drain regions for Performance Enhancement", VLSI Technology, 2006, Digest of Technical Papers, 2006 Symposium on VLSI Technology 2006; pp. 56-57.

\* cited by examiner

METHOD OF MAKING A SHALLOW TRENCH ISOLATION (STI) STRUCTURES

PRIORITY CLAIM

The present application is a continuation of U.S. application Ser. No. 13/012,948, filed Jan. 25, 2011, which is incorporated herein by reference in its entirety.

FIELD

This disclosure relates generally to semiconductor substrate processing and more particularly to processes of oxide in shallow trench isolation (STI).

BACKGROUND

Shallow trench isolations (STIs) are used to separate and isolate active areas on a semiconductor wafer from each other. STIs may be formed by etching trenches, overfilling the trenches with a dielectric such as an oxide, and then removing any excess dielectric with a process such as chemical mechanical polishing (CMP) or etching in order to remove the dielectric outside the trenches. This dielectric helps to electrically isolate the active areas from each other. As circuit densities continue to increase, the planarity of STI structures could impact patterning of polysilicon structures.

BRIEF DESCRIPTION OF THE DRAWINGS

The present disclosure will be readily understood by the following detailed description in conjunction with the accompanying drawings, and like reference numerals designate like structural elements.

DETAILED DESCRIPTION OF THE EXEMPLARY EMBODIMENTS

Figure 1A:
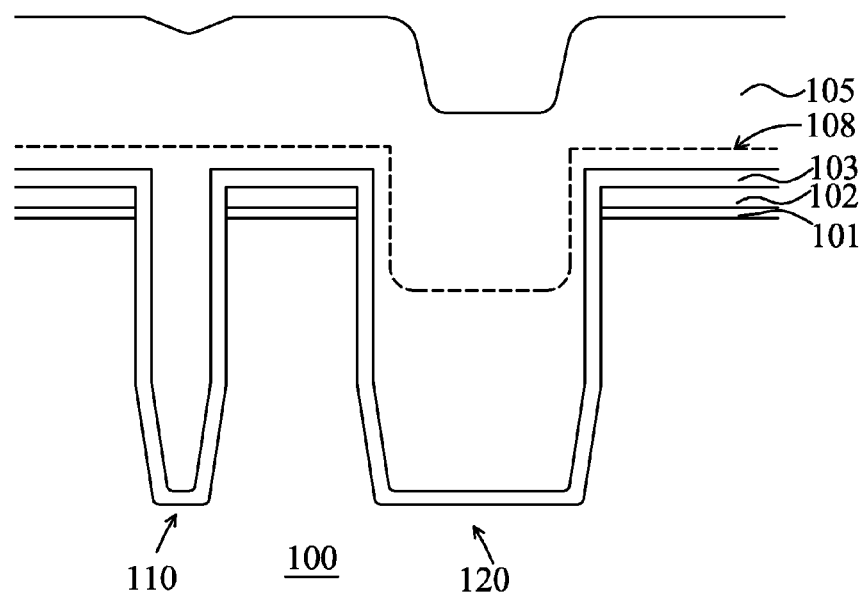
FIGS. 1A-1D show cross-sectional views of STI structures in a process flow, in accordance with some embodiments.

It is to be understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1A shows a cross-sectional view of two shallow trench isolation (STI) structures, in accordance with some embodiments. The two STI structures include a narrow structure 110 and a wide structure 120. In some embodiments, the narrow structure 110 has a width in a range from about 30 nm to about 2000 nm. The STI structures are formed by using a hard mask layer 102 on a semiconductor substrate 100. The semiconductor substrate 100 includes silicon. Alternatively, the substrate 100 includes germanium or silicon germanium. In other embodiments, the substrate 100 may use another semiconductor material, such as diamond, silicon carbide, gallium arsenide, GaAsP, AlInAs, AlGaAs, GaInP, or other proper combination thereof. Furthermore, the semiconductor substrate may be a bulk semiconductor such as bulk silicon. The bulk silicon may further include an epitaxy silicon layer.

In one embodiment, a pad silicon oxide layer 101 is formed on the silicon substrate 100. The pad silicon oxide layer 101 is formed by a thermal oxidation process. In some embodiments, the pad silicon oxide 101 has a thickness ranging from about 50 angstroms to about 200 angstroms. In some embodiments, the hard mask layer 102 is made of silicon nitride and is formed on the pad silicon oxide layer 101. The hard mask layer 102 can be formed by a low pressure chemical vapor deposition (LPCVD) process. For example, the precursor including dichlorosilane (DCS or $SiH_2Cl_2$), bis(tertiarybutylamino)silane (BTBAS or $C_8H_{22}N_2Si$), and disilane (DS or $Si_2H_6$) is used in the CVD process to form the hard mask layer 102. In some embodiments, the hard mask layer 102 has a thickness ranging from about 400 angstroms to about 1500 angstroms. The hard mask layer 102 is then patterned to form a mask for shallow trench etching. Photoresist deposition, lithography and resist development, etching, and post-etch resist removal are involved in forming the hard mask. Alternatively, other dielectric material may be used as the hard mask. For example, silicon oxynitride may be formed as the hard mask.

In some embodiments, the shallow trenches have a depth in a range from about 0.20 microns to about 1 micron for isolation purposes. The shallow trenches are filled with one or more dielectric materials to form trench isolation features 110 and 120, referred to as shallow trench isolation (STI) as well. In some embodiments, a liner layer 103 is used to line the openings of the STIs. The liner layer 103 may be made of silicon dioxide with a thickness in a range from about 0 Å (no liner) to about 300 Å. The lining oxide may be formed by oxidation by using an oxygen gas, or oxygen containing gas mixture, to oxidized the silicon on the surface of the openings of the STIs. For example, the lining oxide layer 103 may be formed by oxidizing the exposed silicon in an oxygen environment at a temperature from about 900° C. to about 1100° C. An annealing process (or anneal) could be performed after the liner layer 103 is deposited to prevent crystalline defects due to the oxidation process.

The openings of the STIs are then filled with a dielectric gapfill layer 105. In some embodiments, the dielectric gapfill layer 105 is made of silicon oxide, which can be filled in the trenches by a CVD process. In various examples, the silicon oxide can be formed by a high density plasma chemical vapor deposition (HDPCVD). The silicon oxide may be alternatively formed by a high aspect ratio process (HARP). In another embodiment, the trench isolation features, 110 and 120, may include a multi-layer structure. In furtherance of the embodiment, the openings may also be filled with other suitable materials, such as silicon nitride, silicon oxynitride, low k materials, air gap, or combinations thereof, to form the trench isolation features.

After the dielectric gapfill layer 105 is deposited, the substrate may undergo an anneal to densify the gapfill layer 105 and to reduce its wet etch rate(s). The densification process can be performed in a furnace or a rapid thermal processing (RTP) chamber. In some embodiments, the post gapfill anneal is performed at a temperature ranging from about 900° C. to about 1100° C. in an RTP chamber for a duration from about 10 seconds to about 1 minute.

Figure 1B:
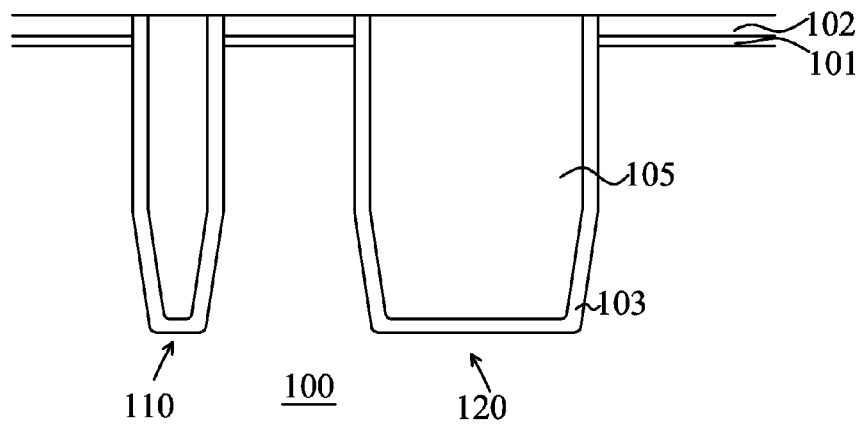

After the trench-filling is done, the substrate undergoes a planarization process to remove excess dielectric outside the STIs. In some embodiments, a chemical mechanical polishing (CMP) process is applied to the semiconductor substrate to remove excessive portions of the trench-filling dielectric material and to form a global planarized surface. As one example, the CMP process may use the hard mask layer 102 as a polishing stop layer so that the CMP process can properly stop at the hard mask layer 102. Other processes may be used to achieve the similar polishing effect. For example, an etch-back process may be used to remove the excessive trench-filling dielectric material and form a global planarized surface. FIG. 1B shows the structure of FIG. 1A after a CMP process using the hard mask layer 102 as a CMP stop layer, in accordance with some embodiments.

Figure 1C:
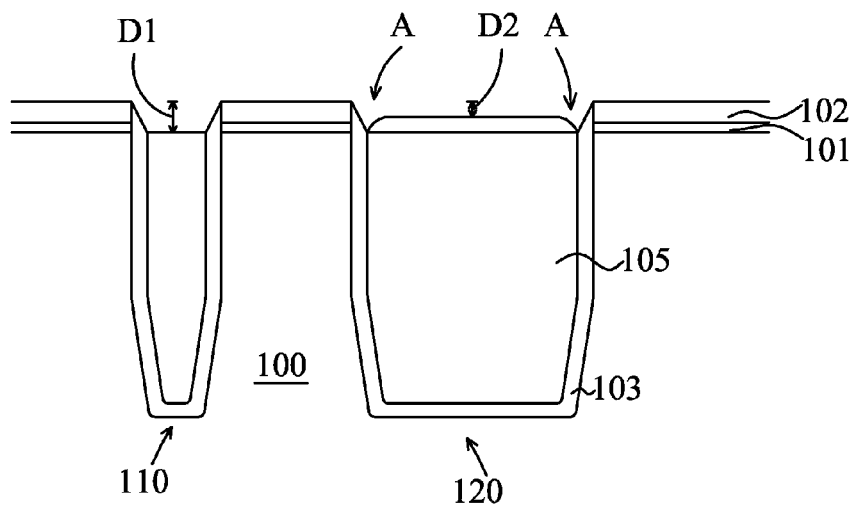

After the CMP is performed, a wet oxide etch may be performed to adjust the height of the dielectric material in the STIs in anticipation of the removal of the hard mask layer 102. The hard mask layer 102 and the pad silicon oxide layer 101 will be removed eventually, since they are sacrificial layers. In order for the surface of the substrate to be flat for easier and better photolithographical patterning, a portion of the oxide films in the trenches need to be removed. In some embodiments, the oxide removal is performed by a diluted HF dip. In some embodiments, the targeted amount of oxide removed is in a range from about 200 Å to about 1300 Å. FIG. 1C shows a schematic diagram of the structure of FIG. 1B after the dilute HF dip, in accordance with some embodiments. In some embodiment, the dilute HF is prepared by mixing HF with water at a ratio, such as 50:1 water to HF ratio. The dilute HF dip has a higher oxide removal rate of oxide in the narrow trench 110 than the wider trench 120. FIG. 1C shows that D1 (oxide etch depth in narrow shallow trench isolation 110) is larger than D2 (oxide etch depth in wider shallow trench isolation 120). In addition, at the corner (s) A of the wide STI 120, there is a V-shaped dip, which is also called an STI divot, which is a result of high local etch rate.

Figure 1D:
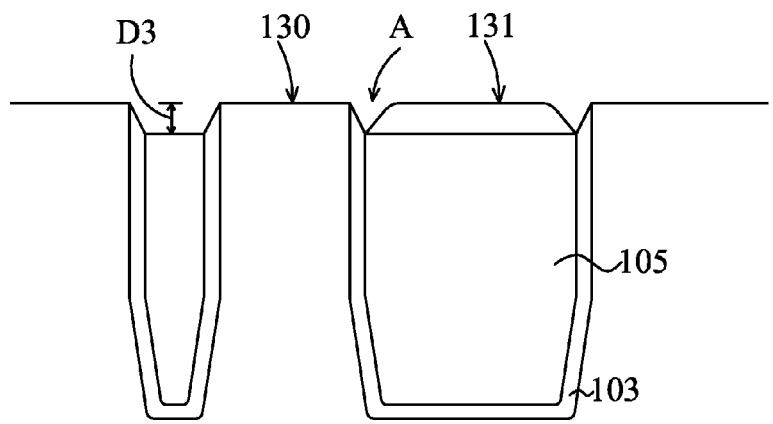

The higher etch rate could be a result of different degree of oxide density after the annealing (or densification process) described above. FIG. 1A shows a dotted line 108, which indicated a boundary of densification (by annealing) after gap fill of the STIs. The upper portion of the dielectric gapfill layer 105 is better densified than the lower portion of layer 105, which is separated from the upper portion by dotted line 108. A portion of the dotted line 108 remains after dielectric CMP, as shown in FIG. 1B. Both FIGS. 1A and 1B show that the dielectric gapfill layer inside the narrow STI 110 is not well densified. As a result, the etch depth D1 is larger than etch depth D1 due to higher etch rate of un-densified layer 105. FIG. 1B also show that a narrow portion near the corner(s) A of the wide STI 120 is not well densified, which results in the V-shape corner recess (or STI divot). The dilute HF dip creates a height difference between the wide and narrow STIs and also the STI corner recess (divot). After the dilute HF is performed to lower the surfaces of the STI structures, the hard mask layer 102 is removed by etching. Substrate 100 could undergo further processing until patterning of polysilicon to form gate structure. During these process operations, the there are wet processes used to remove dielectric layers, such as the removal pad oxide layer 101, and a sacrificial oxide layer (not shown) used in patterning and implanting the diffusion regions (also not shown). Such dielectric-removing wet processes further worsen the step height difference between the narrow STI and wide STI, and also the corner recess issue (STI divot). FIG. 1D shows the narrow STI 110 and wide STI 120 after the removal of the hard mask layer 102, the pad oxide layer 101, and also the deposition and removal of a sacrificial oxide layer (not shown), in accordance with some embodiments. FIG. 1D shows although the surface 131 of the wide STI 120 is at the same level as the surface 130 of silicon, the central surface of the narrow STI 110 is below the silicon surface 130 by a depth of $D_3$, which become quite significant after multiple wet etching operations. In addition, the divot at corner locations A is quite severe. The severe recess in the shallow STI 110 and the divot at corners "A" would severely impact the photolithography of the gate patterning and possibly inter-level dielectric (ILD) (or ILD0) gapfill between gate structures. Therefore, it's important to improve the wet etch uniformity between wide and narrow STI structures and also the corners of wide STI structures.

Figure 2A:
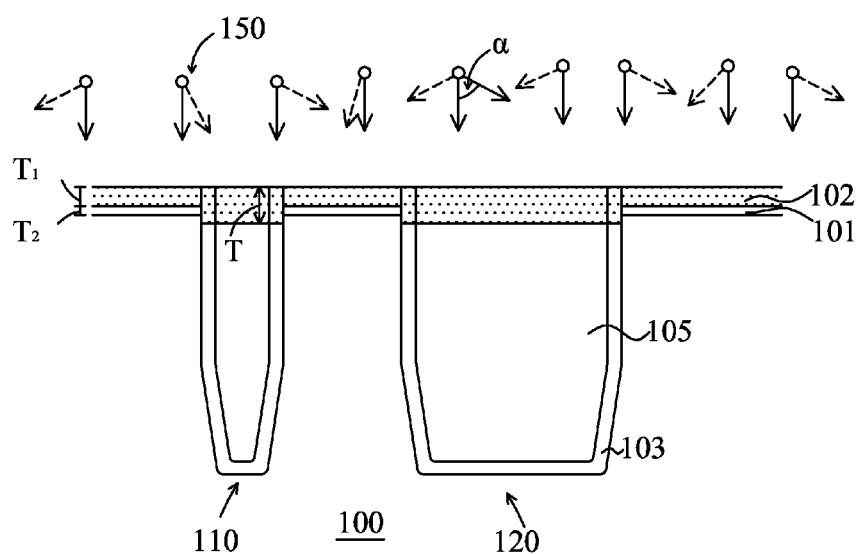
FIGS. 2A and 2D-2F show cross-sectional views of STI structure in a process flow with carbon doping, in accordance with some embodiments.

One way to reduce wet etch rate of oxide is by doping the oxide with carbon (C). FIG. 2A shows dopant being implanted into the surface of the substrate 100 after CMP, in accordance with some embodiments. The hard mask layer 102 may be used as a doping (or implant) mask to protect the silicon regions (active regions), B and C, underneath. The doping (or implant) of carbon may be performed by ion beams (ion implantation, or beam line) or by plasma implantation. FIG. 2A shows carbon ions 150, being directed toward substrate 100 and implanted into the surface of substrate 100, which include hard mask layer 102, liner oxide layer 103, and dielectric gapfill layer 105. If the hard mask layer 102 is made of silicon nitride, silicon nitride is harder to dope (or implant) than silicon oxide film(s). Only surface layer of the oxide film(s) needs to be doped. FIG. 2A shows the dopant has a thickness of T in the dielectric gapfill layer 105 and the liner layer 103, in accordance with some embodiments. The thickness T should be larger than the thickness T1 of the hard mask layer 102 after CMP and the thickness T2 of the pad oxide layer 101. Because the carbon dopants needs to be at the surface of the STIs 110 and 120 after the hard mask layer 102 and pad oxide layer 101 are removed to protect the STIs 110 and 120 from wet etch loss. In some embodiments, the thickness T is in a range from 200 Å to about 1300 Å.

If the doping is performed by ion beams, the dopants, which are ions, may be directed toward substrate 100 vertically (solid arrows), or tilted at an angle "α". The angle may be about zero or greater than zero. In some embodiments, the angle is in a range from about 0° to about 60°. In other embodiments, the angle is in a range from about 0° to about 30°. Due to the relative shallowness of the doped layer 160, the doping energy is relatively low. In some embodiments, the doping energy is in a range from about 2 KeV to about 60 KeV. The dopant concentration is in a range from about 1E12 1/cm$^3$ to about 1E17 1/cm$^3$. In some embodiments, the temperature of the implant process is in a range from about −150° C. to about room temperature (about 25° C.).

Figure 2B:
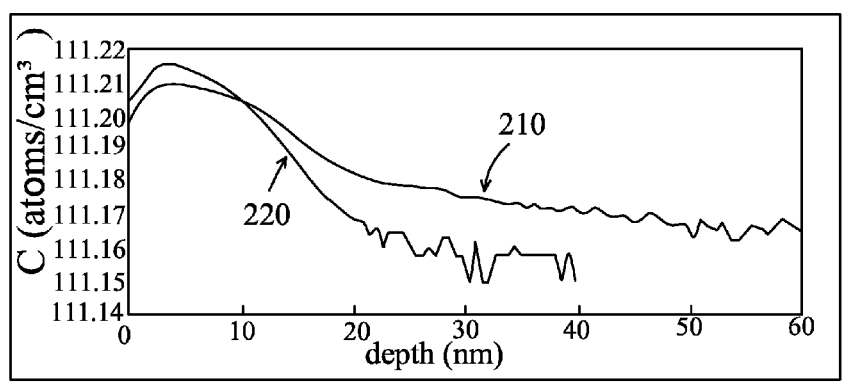
FIG. 2B shows dopant profiles of doping by ion beams and by plasma doping, in accordance with some embodiments.

As mentioned above, the doping may also be achieved by plasma doping (or PLAD). Since the plasma ions in the plasma sheath could move in different directions, not just directed towards the substrate as for the dopants from ion beams, the plasma ions 150 are illustrated by dotted arrows. Plasma doping (or PLAD) is ideal for shallow doping. The dopant plasma ions 150 arrive at the substrate surface in a range of angles, instead of being at a certain angle as in the case of ion implantation by ion beams. Plasma ions often have lower energy than the ions of ion beams. As a result, it's ideal for shallow doping. FIG. 2B shows dopant profiles as a function of depth for doping by ion beams and by PLAD, in accordance with some embodiments. Curve 210 shows a dopant profile by ion beams and curve 220 shows a dopant profile by PLAD. PLAD can have higher surface concentration with a more rapid decrease in dopant concentration with depth, which indicates better depth control for shallow doping. In contrast, ion beam doping is suitable for deeper implants. If the depth T of the doping is less than about 800 Å, PLAD is used, in accordance with some embodiments. For larger dopant depth, either doping method (ion beams or PLAD) is used. In some embodiments, a depth of the doped region is in a range from about 50 nm to about 800 nm.

Plasma doping is performed in a plasma doping system. An example of plasma doping systems is a PLAD system, made by Varian Semiconductor Equipment Associates Inc. of Gloucester, Mass. The doping gas is made by one or more carbon-containing gas, such as $CH_4$, $C_xH_y$ (where x and y are integers), or a combination thereof. In some embodiments, x is in a range from 2 to 12 and y is in a range from 2 to 26. The doping gas may also include a carrier gas, such as $H_2$, He, Ar, Ne, Kr, Xe. The percentage of the carbon-containing gas may be in a range from about 1% to about 100%. In some embodiments, the process gas flow is in a range from about 50 sccm to about 500 sccm. In some embodiments, the pressure of the plasma process is in a range from about 5 mTorr, to about 50 mTorr. The RF (radio frequency) power is in a range from about 100 watts (W) to about 1000 W and at a radio frequency in a range from about 2 kilohertz (KHz) to about 13.6 megahertz (MHz), in accordance with some embodiments. The substrate may be or may not be biased. The dopant depth can be increased, if the substrate is biased. In some embodiments, the bias voltage is in a range from about 0 KV to about 10 KV. In some embodiments, the RF power supply can have dual frequencies. The doping plasma may be generated in the processing chamber or remotely (remote plasma). In some embodiments, the dosage of the dopant (carbon) is in a range from about $1E12$ $1/cm^3$ to about $1E17$ $1/cm^3$.

Figure 2C:
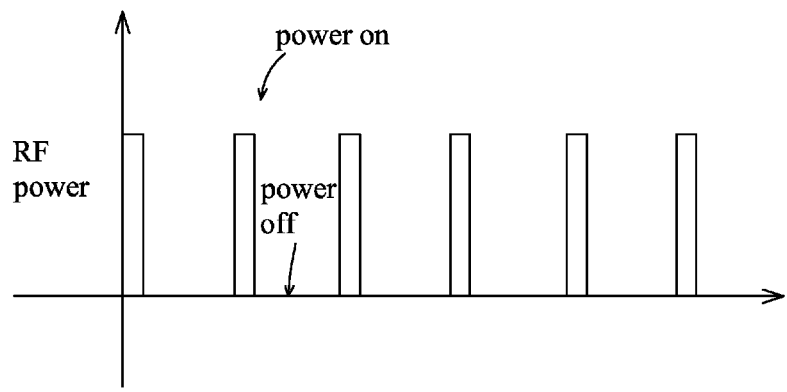
FIG. 2C shows RF power as a function of time for a pulsed plasma reactor, in accordance with some embodiments.

The radio frequency (RF) power for generating the plasma could be pulsed. FIG. 2C shows a diagram of power cycle of a pulsed plasma, in accordance with some embodiments. FIG. 2C shows that the RF power is turned on and off periodically. The duty ratio (power-on-time/total-time) of pulse could be in a range from about 5% to about 95% in accordance with some embodiments. In some embodiments, the plasma doping is performed for duration in a range from about 10 seconds to about 5 minutes.

Figure 2D:
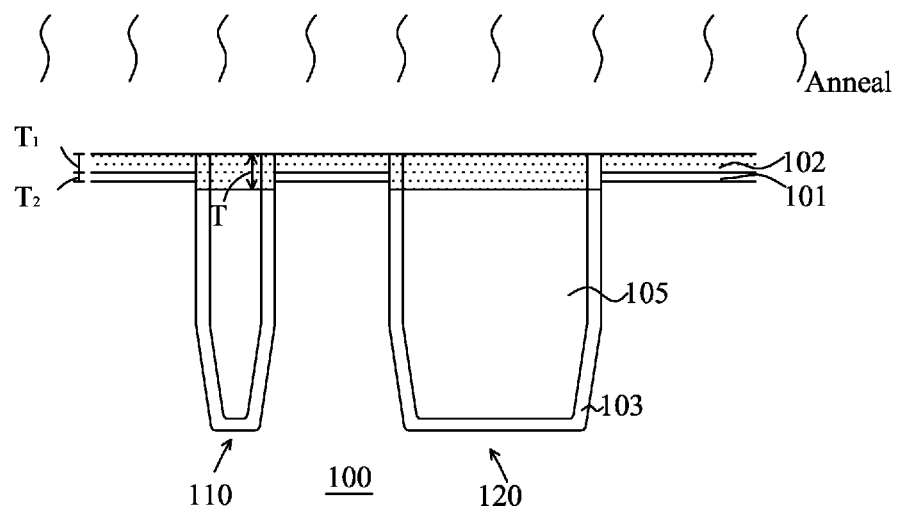

After the doping is performed, the substrate is annealed to allow the carbon atoms to settle in the oxide layer, in accordance with some embodiments. In some other embodiments, the anneal operation can be skipped. The annealing temperature may be in a range from about 900° C. to about 1350° C. The annealing used may be performed by rapid thermal annealing (RTA) or by furnace anneal. Alternatively, the annealing process can be laser anneal or flash anneal. In some embodiments, the annealing time can be in a range from about 50 µs (micro seconds) to about 10 minutes. FIG. 2D shows that the substrate of FIG. 2A is annealed, in accordance with some embodiments. The heat can be provided to the front side of the substrate, backside of the substrate, or both front and back sides of the substrate. In some embodiments, this anneal operation can be skipped.

Figure 2E:
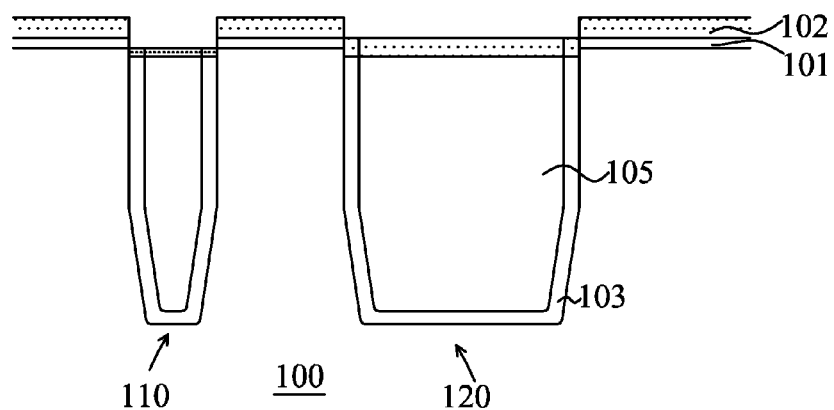

After the substrate is annealed, a dilute HF dip can be performed to reduce the height of oxide in the STIs. The oxide in the STIs is removed so that the substrate surface would be substantially flat after the hard mask layer 102 and pad oxide layer 101 are removed. FIG. 2E shows a cross-sectional view of substrate 100 after a dilute HF dip, in accordance with some embodiments. Due to the doping of carbon, the surface layer of the oxide film in both narrow and wide STIs has the same wet etch rate. As a result, the problems of higher etch rate in the narrow STIs and also at corners of wide STIs are resolved. The hard mask layer 102 protects the silicon underneath from being damaged by the doping process. FIG. 2E shows a cross sectional view of the substrate of FIG. 2D after a dilute HF dip, in accordance with some embodiments. The recess D11 in the narrow STI 110 and the recess D12 in the wide STI 120 are about the same. The reduced etch rate of carbon-doped oxide film makes controlling of the depths of the recess in narrow STI 110 and wide STI 120 easier and better. In addition, there is no STI divot in the corners of wide STI 120.

Figure 2F:
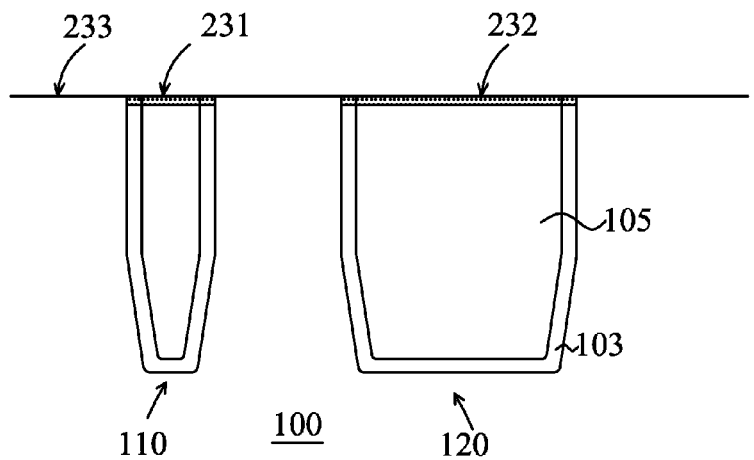

After the dilute HF dip, the hard mask layer 102 and the pad oxide layer 101 are removed. These two layers may be removed by dry etching and/or wet etching. FIG. 2F shows a cross sectional view of the substrate of FIG. 2E after the hard mask layer 102 and the pad oxide layer 101 are removed, in accordance with some embodiments. FIG. 2F shows that the surfaces 231, 232 of the STIs 110 and 120 are at about the same horizontal levels as the surface 233 of silicon. The surface layer(s) of the STIs 110 and 120 is doped by carbon, which protects the oxide in STIs 110, 120 from being excessively etched by subsequent wet etch processes.

Figure 3:
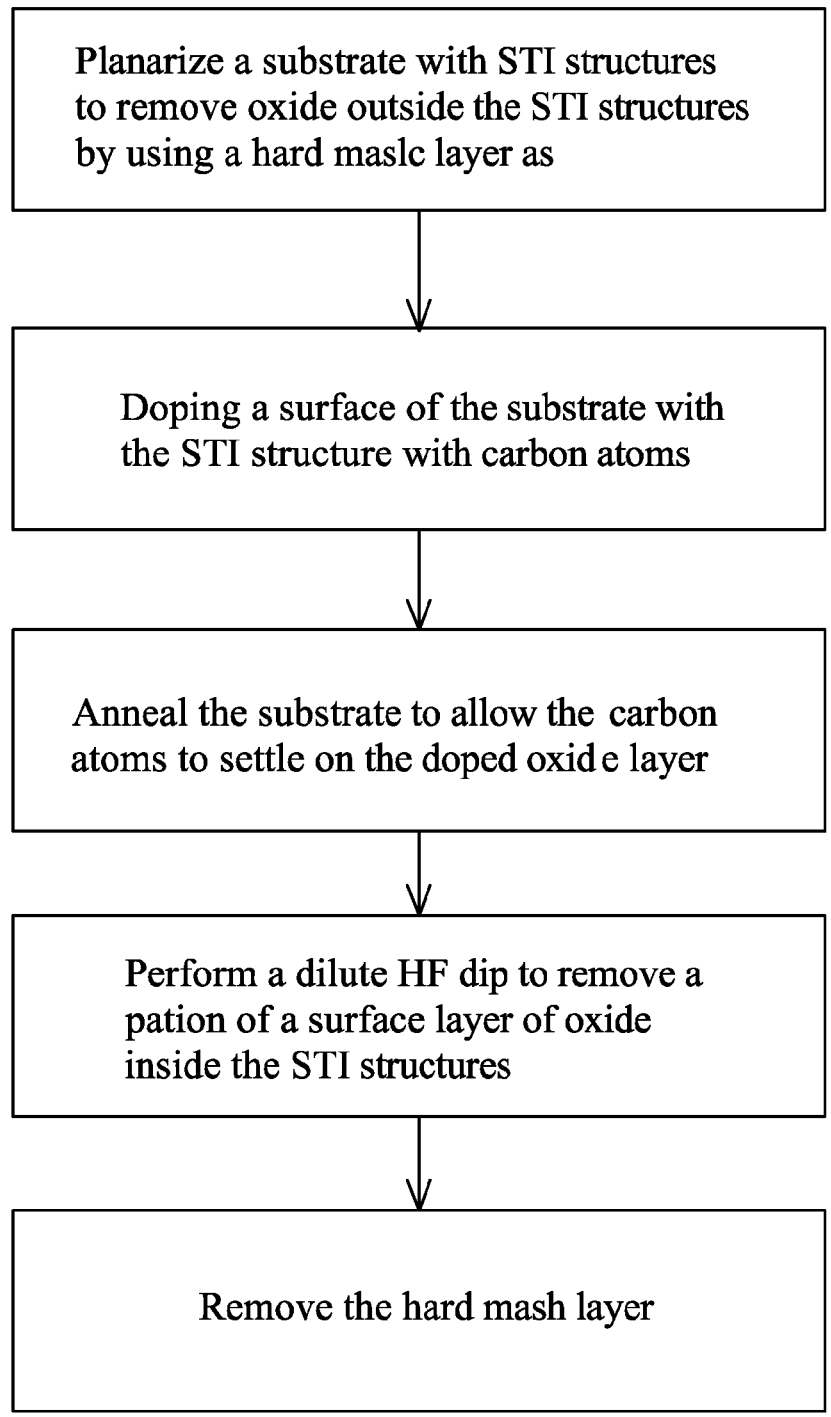
FIG. 3 shows a process flow of doping oxide surface of STI structures to improve uniformity of wet etch rate, in accordance with some embodiments.

FIG. 3 shows a process flow 300 of doping the surface of oxide in STIs with carbon to make the etch rate of surface oxide in narrow and wide STIs the same and without corner issues, in accordance with some embodiments. At operation 301, a substrate with STI structures are planarized with CMP to remove excess oxide outside the STI structures. At operation 302, the surface of the substrate is doped with carbon. The carbon doping can be performed by ion beams or by plasma doping (PLAD). After carbon doping, the substrate is annealed to allow carbon atoms to settle in the oxide film (or doped oxide layer) in the STIs at operation 303. In some embodiments, operation 303 is skipped and the substrate is not annealed after carbon doping. Afterwards, a dilute HF dip is performed to reduce the thickness of oxide in the STIs (to create recesses in the STIs) at operation 304. Since the removed oxide is carbon-doped, the removal rate is about the same in the narrow STIs and wider STIs. Further, the carbon doping resolves the issue or weak corners in wide STIs. After the HF dip, the hard mask layer is then removed at operation 305. The pad oxide layer may also be removed after the hard mask layer is removed.

The embodiments described above provide methods and structures for doping oxide in the STIs with carbon to make etch rate in the narrow and wide structures equal and also to make corners of wide STIs as strong as other surface portion of the wide STIs. Such carbon doping can be performed by ion beam (ion implant) or by plasma doping. The hard mask layer can be used to protect the silicon underneath from doping. By using the doping mechanism, the even surface topography of silicon and STI enables patterning of gate structures and ILD0 gapfill for advanced processing technology.

One aspect of this description relates to a method of making shallow trench isolation (STI) structures. The method includes forming a first opening in a substrate and filling the first opening with silicon oxide to form a first STI structure. The method further includes doping a top surface of the silicon oxide with carbon, wherein a bottom portion of the silicon oxide is free of carbon. The method further includes planarizing the silicon oxide so that the top surface of the silicon oxide is at substantially a same level as a surface of the substrate surrounding the silicon oxide.

Another aspect of this description relates to a method of making a shallow trench isolation (STI) structure. The method includes forming an opening in a substrate, and forming a liner layer conformally in the opening. The method further includes forming a silicon oxide in the opening, wherein the liner layer is between the silicon oxide and the substrate. The method further includes doping a top surface of the silicon oxide and a top surface of the liner layer with carbon, wherein a bottom portion of the silicon oxide and a bottom portion of the liner layer are free of carbon. The method further includes planarizing the silicon oxide so that the top surface of the silicon oxide and the top surface of the liner layer are at substantially a same level as a surface of the substrate.

Still another aspect of this description relates to a method of making shallow trench isolation (STI) structures. The method includes forming a first opening in a substrate, and forming a second opening in the substrate, the second opening having a width greater than the first opening. The method further includes filling the first opening and the second opening with silicon oxide, and doping a top surface of the silicon oxide with carbon, wherein a bottom portion of the silicon oxide is free of carbon. The method further includes planarizing the silicon oxide so that the top surface of the silicon oxide is at substantially a same level as a surface of the substrate surrounding the silicon oxide.

Various modifications, changes, and variations apparent to those of skill in the art may be made in the arrangement, operation, and details of the methods and systems disclosed. Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of making shallow trench isolation (STI) structures, the method comprising:
    forming a first opening in a substrate;
    filling the first opening with silicon oxide to form a first STI structure;
    doping a top surface of the silicon oxide with carbon, wherein a bottom portion of the silicon oxide is free of carbon; and
    planarizing the silicon oxide so that the top surface of the silicon oxide is at substantially a same level as a surface of the substrate surrounding the silicon oxide.

2. The method of claim 1, further comprising:
    forming a second STI structure having a width larger than the first, the second STI structure surrounded by the substrate, wherein forming the second STI structure comprises:
        forming a second opening in the substrate, and
        filling the second opening with silicon oxide, wherein a third surface of the second STI structure is at substantially a same level as a fourth surface of the substrate surrounding the second STI structure, and the silicon oxide on the third surface of the second STI structure is doped with carbon.

3. The method of claim 2, wherein forming the second STI structure comprises filling the second opening so the third surface of the second STI structure is at about a same level as the top surface of the first STI structure.

4. The method of claim 2, wherein forming the first opening comprises forming the first opening having a width in a range from about 30 nm to about 2000 nm.

5. The method of claim 2, wherein forming the second STI structure comprises forming the third surface of the second STI structure extends to the edge of the STI structure, and the third surface is substantially planar without substantial dipping at the edges of the third surface.

6. The method of claim 1, wherein doping the top surface of the silicon oxide comprises doping the silicon oxide to form a depth of the peak carbon dopant concentration in the first STI structure in a range from about 50 nm to about 800 nm.

7. The method of claim 1, further comprising doping a top surface of the substrate surrounding the first STI structure with carbon.

8. The method of claim 1, further comprising forming a liner layer in the first opening, the liner layer having a thickness in a range from about 0 Å to about 300 Å.

9. The method of claim 8, wherein forming the liner layer comprises forming the liner layer between the silicon oxide of the first STI structure and the substrate.

10. The method of claim 8, further comprising doping a surface region of the liner layer with carbon.

11. A method of making a shallow trench isolation (STI) structure, the method comprising:
    forming an opening in a substrate;
    forming a liner layer conformally in the opening;
    forming a silicon oxide in the opening, wherein the liner layer is between the silicon oxide and the substrate;
    doping a top surface of the silicon oxide and a top surface of the liner layer with carbon, wherein a bottom portion of the silicon oxide and a bottom portion of the liner layer are free of carbon; and
    planarizing the silicon oxide so that the top surface of the silicon oxide and the top surface of the liner layer are at substantially a same level as a surface of the substrate.

12. The method of claim 11, wherein doping the top surface of the silicon oxide comprises doping the silicon oxide to a depth in a range from about 50 nm to about 800 nm.

13. The method of claim 11, wherein planarizing the silicon oxide comprises planarizing the top surface substantially planar without substantial dipping at edges of the top surface.

14. The method of claim 11, wherein planarizing the silicon oxide comprises planarizing the top surface to substantially the same level as a top surface of the substrate.

15. The method of claim 14, further comprising doping the substrate surrounding the STI structure with carbon.

16. The method of claim 11, wherein forming the liner layer comprises forming the liner layer having a thickness in a range from about 0 A to about 300 A.

17. The method of claim 16, wherein forming the silicon oxide comprises forming an interface between the liner layer and the silicon oxide.

18. A method of making shallow trench isolation (STI) structures, the method comprising:
    forming a first opening in a substrate;
    forming a second opening in the substrate, the second opening having a width greater than the first opening;
    filling the first opening and the second opening with silicon oxide;
    doping a top surface of the silicon oxide with carbon, wherein a bottom portion of the silicon oxide is free of carbon, and
    planarizing the silicon oxide so that the top surface of the silicon oxide is at substantially a same level as a surface of the substrate surrounding the silicon oxide.

19. The method of claim 18, further comprising forming a liner layer conformally with the first opening and conformally with the second opening, wherein the liner layer is between the substrate and the silicon oxide.

20. The method of claim 18, further comprising doping a top surface of the liner layer with carbon.

* * * * *